(12) United States Patent
Park et al.

(10) Patent No.: US 7,680,169 B2
(45) Date of Patent: Mar. 16, 2010

(54) SELF-MODE LOCKED MULTI-SECTION SEMICONDUCTOR LASER DIODE

(75) Inventors: Kyung-Hyun Park, Daejeon (KR); Dae-Su Yee, Daejeon (KR); Dong-Churl Kim, Daejeon (KR); Young-Ahn Leem, Daejeon (KR); Sung-Bock Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 123 days.

(21) Appl. No.: 10/726,141

(22) Filed: Dec. 1, 2003

(65) Prior Publication Data

US 2004/0125851 A1    Jul. 1, 2004

(30) Foreign Application Priority Data

Dec. 17, 2002 (KR) .................. 10-2002-0080707

(51) Int. Cl.
*H01S 5/00* (2006.01)
(52) U.S. Cl. .............. 372/50.1; 372/50.11; 372/50.123; 372/50.122; 372/50.22
(58) Field of Classification Search ............ 372/50.122, 372/50.11, 50.123, 50.22, 50.1
See application file for complete search history.

(56) References Cited

U.S. PATENT DOCUMENTS

| | | | | | |
|---|---|---|---|---|---|
| 4,995,048 | A | * | 2/1991 | Kuindersma et al. | 372/50.11 |
| 5,175,643 | A | * | 12/1992 | Andrews | 359/339 |
| 5,177,758 | A | * | 1/1993 | Oka et al. | 372/50.11 |
| 5,220,573 | A | * | 6/1993 | Sakata et al. | 372/50.21 |
| 5,602,866 | A | * | 2/1997 | Fukunaga | 372/96 |
| 5,841,799 | A | * | 11/1998 | Hiroki | 372/19 |
| 6,018,541 | A | * | 1/2000 | Huang | 372/50.11 |
| 6,031,860 | A | * | 2/2000 | Nitta et al. | 372/50.11 |
| 2003/0063647 | A1 | * | 4/2003 | Yoshida et al. | 372/50 |
| 2003/0147617 | A1 | * | 8/2003 | Park et al. | 385/131 |

FOREIGN PATENT DOCUMENTS

JP    06-053596    2/1994

OTHER PUBLICATIONS

Sartorius et al. ("Dispersive Self Q-Switching in Self-Pulsating DFB Lasers", IEEE JQE, vol. 33 No. 2, Feb. 1997, pp. 211-217).*
"High-Frequency Oscillations and Self-mode Locking in Short External-Cabity Laser Diodes", A. Tager, et al., IEEE Journal of Quantum Electronics, vol. 30, No. 7, Jul. 1994.
"Optical Microwave source", S. Bauer, et al., Electronics Letters, Mar. 27, 2002, vol. 38, No. 7.

* cited by examiner

*Primary Examiner*—Minsun Harvey
*Assistant Examiner*—Tod T Van Roy
(74) *Attorney, Agent, or Firm*—Blakely, Sokoloff, Taylor & Zafman

(57) ABSTRACT

A multi-section semiconductor laser diode is disclosed. The laser diode includes a complex-coupled DFB laser section that includes a complex-coupled grating and an active structure for controlling the intensity of oscillating laser light, to oscillate laser light in a single mode, and an external cavity including a phase control section and an amplifier section, the phase control section having a passive waveguide that controls a phase variation of feedback laser light, the amplification section having an active structure that controls the strength of the feedback laser light. Currents are separately provided to the three sections to generate optical pulses with tuning range of tens of GHz. Applications include the clock recovery in the 3R regeneration of the optical communication.

10 Claims, 1 Drawing Sheet

SELF-MODE LOCKED MULTI-SECTION SEMICONDUCTOR LASER DIODE

CROSS REFERENCE TO RELATED APPLICATION

This application is based on Korea Patent Application No. 2002-80707 filed on Dec. 17, 2002 in the Korean Intellectual Property Office, the content of which is incorporated herein by reference.

BACKGROUND OF THE INVENTION (a) Field of the Invention

The present invention relates to a laser diode for generating frequency-tunable optical pulses, used for 3R regeneration (re-timing, re-shaping, and re-amplifying) of restoring an optical signal deformed while being transmitted through an optical fiber to its original state, and for generation of high bit-rate optical signals. More particularly, the invention relates to a self-mode locked multi-section semiconductor laser diode that can be fabricated on a single substrate and that includes a complex-coupled DFB (distributed feedback) laser section.

(b) Background of the Related Art

In an optical communication system, an optical signal transmitted through an optical fiber is subjected to reduction of its magnitude and temporal deformation due to dispersion while it is being transmitted. To correct this to restore the optical signal to its original state, 3R regeneration (re-timing, re-shaping, and re-amplifying) is required. Among this 3R regeneration, re-timing is extracting a clock from the deformed signal to obtain a restored signal from the clock and a deformed optical signal through a decision element. Methods of extracting the clock include electrical and optical methods.

A. A. Tager published the theoretical background of generation of optical pulses according to a short external-cavity laser diode, entitled "High-frequency oscillations and self-mode locking in short external-cavity laser diodes" in IEEE J. Quantum Electron, Vol. 30. According to this article, high-frequency optical pulses can be generated according to self-mode locking of compound cavity modes. Specifically, this article discloses that an optical pulse of tens of GHz can be acquired by self-mode locking of compound cavity modes by appropriately controlling the light beam strength and phase variation when a laser beam output from the single-mode laser diode is propagated through an external cavity and again fed back to the laser diode in the single-mode laser diode structure including the short external cavity having a length less than several millimeters.

S. Bauer published the self-mode locked DFB laser diode structure in Electron. Lett. Vol. 38, issued in March of 2002. This laser diode has an index-coupled DFB laser section and an external cavity including a phase control section and an amplifier section. The strength and phase of a light beam, which propagates through the external cavity and is then fed back to the DFB laser region, are controlled by injection currents of the amplifier section and the phase control section, and the injection currents are varied to obtain a wide frequency tuning range of tens of GHz. However, this technique may adversely affect the generation of an optical pulse and stable frequency variation because there is a probability of occurrence of mode hopping or multi-modes in the index-coupled DFB laser section according to a feedback phase variation in actual applications.

SUMMARY OF THE INVENTION

An advantage of the present invention is to provide a self-mode locked multi-section semiconductor laser diode including a single-mode laser section that has no occurrence of mode hopping or multi-modes even in the event of feedback phase variation.

In one aspect of the present invention, a self-mode locked multi-section semiconductor laser diode, comprises a complex-coupled DFB laser section that includes a complex grating and an active structure for controlling the intensity of oscillating laser light, to oscillate laser light in a single mode; and an external cavity including a phase control section and an amplifier section, the phase control section having a passive waveguide that controls a phase of feedback laser light, the amplifier section having an active structure that controls the strength of the feedback laser light, the complex-coupled DFB laser section and the external cavity being monolithically integrated.

The sections can be integrated in a way that the waveguide of the phase control section is arranged through butt-coupling such that its central axis accords with those of the active structures of the complex-coupled DFB laser section and the amplifier section, or in a way that the complex-coupled DFB laser section, the phase control section, and the amplifier section are constructed in evanescent-coupling in which the sections have a common guiding layer.

The complex-coupled grating may be a gain-coupled grating formed in an active structure or a loss-coupled grating formed in an additional absorptive layer, and the laser diode can be fabricated according to buried heterostructure, ridge structure, or the like.

As described above, the laser diode of the present invention includes the complex-coupled DFB laser section that has a specific single oscillation mode irrespective of feedback phase variation so that mode hopping or multi-modes according to feedback phase variation are not occurred.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention, and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
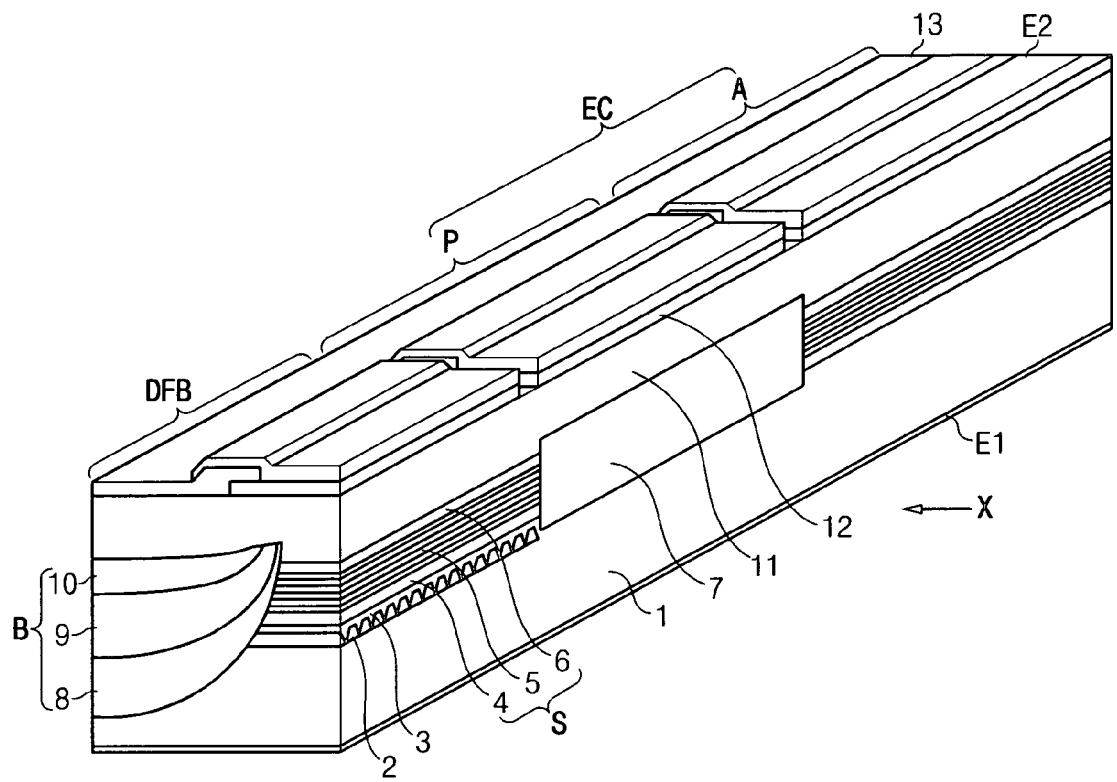
FIG. 1 illustrates the structure of a self-mode locked three-section semiconductor laser diode according to the present invention.

FIG. 1 illustrates a self-mode locked three-section semiconductor laser diode having a buried heterostructure and including a loss-coupled DFB laser section according to the present invention.

Referring to FIG. 1, the present invention comprises an external cavity EC including a phase control section P and an amplifier section A, and a DFB laser section DFB. A complex-coupled grating 2 is located on an n-InP substrate 1. The area of the grating corresponds to the DFB laser section DFB. An n-InP layer 3 having a thickness of 100 nm approximately covers the grating 2. The complex-coupled grating 2 is formed of InGaAs having a bandgap wavelength of longer than 1.55 μm so that loss is longitudinally and periodically varied as well as an effective refractive index. That is, the complex-coupled grating 2 is a loss-coupled grating, but the DFB laser section may have any kinds of complex-coupled DFB laser structure.

An active structure S of a separate confinement heterostructure (SCH) made of a first guiding layer 4, an active layer 5, and a second guiding layer 6 is formed only at the portion corresponding to the DFB laser section DFB and the amplifier section A. Each of the first and second guiding layers 4 and 6 has a thickness of 70 nm, and is formed of InGaAsP having a band gap of 1.3 μm. The active layer 5 has a multi-quantum-well structure with a band gap of 1.55 μm, which includes wells and barriers made of InGaAsP.

A guiding layer 7 is formed in close proximity to the n-InP substrate 1 at the region interposed between two active structures S, corresponding to the phase control section P. The guiding layer 7 is formed of InGaAsP having a band gap of 1.3 μm and has a thickness of 400 nm. The guiding layer is butt-coupled with the active structures S such that the central axis of the guiding layer accords with those of the active structures.

Current blocking layers B, each of which is formed in a manner such that a p-InP layer 8, an n-InP layer 9, and a p-InP layer 10 are sequentially deposited, are provided on both sides of the active structure S and the guiding layer 7 having a width of about 1 μm.

Figure 2:
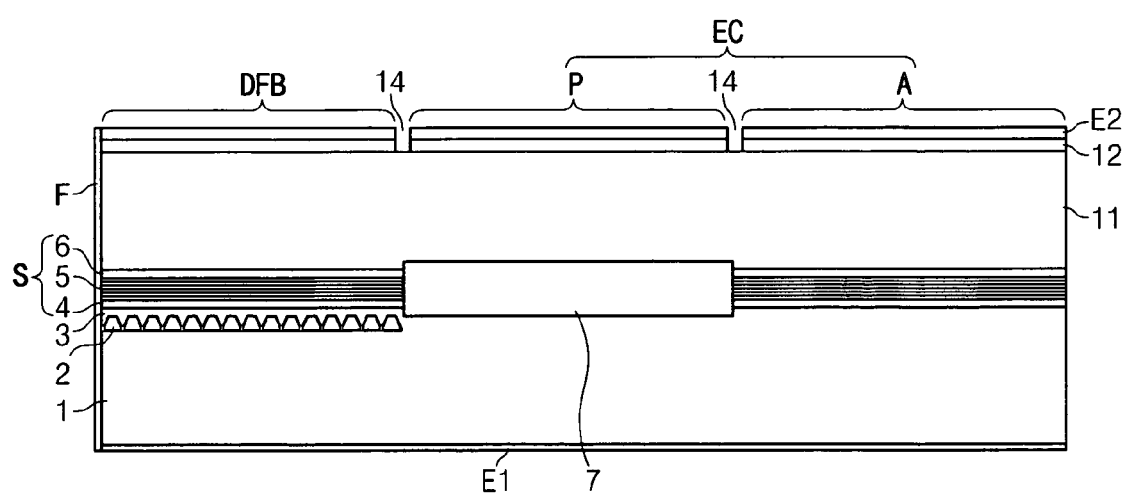
FIG. 2 is a cross-sectional view of FIG. 1 taken along the line indicated by the arrow X.

Moreover, a p-InP clad layer 11 is deposited on the guiding layer 7, on the active structures S placed at both sides of the guiding layer 7, and on the current blocking layers B. A p-InGaAs layer 12 having a thickness of 300 nm is formed on the p-InP clad layer 11, to reduce contact resistance with a metal film E2. A SiNx film 13 having an opening for injection current is coated on the p-InGaAs layer 12, and the metal layer E2 is formed on the SiNx film 13 including the opening. A metal film E1 is formed beneath the n-InP substrate 1. The metal films E1 and E2 serve as electrodes. As shown in FIG. 2, the amplifier section A, phase control section P, and DFB laser section DFB are electrically separated from one another according to a groove 14 having a width of about 10 μm so that neighboring sections have a resistance of greater than several hundreds of Ω between them.

In this embodiment, the DFB laser section DFB, phase control section P and amplifier section A have lengths of 300 μm, 400 μm, and 200 μm, respectively. Although the three sections are arranged in the order of the DFB laser section DFB, phase control section P, and amplifier section A in this embodiment, they can be arranged in the order of the DFB laser section DFB, amplifier section A, and phase control section P.

The facet of the DFB laser section DFB is coated with an anti-reflection film F, whereas the facet of the amplification section A, opposite to the facet of the DFB laser section, is left as cleaved or coated with a high-reflection film.

The three sections DFB, P, and A are provided with direct current independently. Specifically, a current higher than a threshold current value is applied to the DFB laser section DFB so that the laser diode oscillates in a single mode. The oscillated laser beam propagates to the external cavity formed according to the phase control section P and amplifier section A, and then it is fed back to the DFB laser section DFB. Here, the strength and phase variation of the feedback beam are controlled by the injection currents applied to the amplifier section A and phase control section P. When the strength and phase variation of the feedback light are appropriately adjusted, an optical pulse of tens of GHz is generated according to self-mode locking of compound cavity modes. Also, the frequency of the optical pulse can be varied by controlling the strength and phase variation of the feedback beam.

Furthermore, the present invention uses the complex-coupled DFB laser section, which is different from an index-coupled DFB laser section, so that a specific single mode oscillates all the time irrespective of a phase variation of feedback beam. Thus, the frequency of the optical pulse is stably varied.

Moreover, when an optical signal of a wide range of rates that has been deformed while being transmitted is applied to the laser diode of the present invention, optical clock signals corresponding to the rate of the optical signal can be extracted according to injection locking. Accordingly, the laser diode can be used for clock recovery in a 3R regeneration.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

The present invention uses a complex-coupled DFB laser section that has a specific single oscillation mode all the time, so that a feedback phase variation cannot affect the single-mode oscillation to create mode hopping or multi-modes. Furthermore, since the external cavity composed of the amplifier section and phase control section can control the strength and phase variation of a beam fed back to the DFB laser section, an optical pulse whose frequency can be stably varied within a wide range can be generated. Accordingly, the laser diode of the invention can be used for data transmission in ultra-high-speed optical communications.

What is claimed is:

1. A self-mode locked multi-section semiconductor laser diode, comprising:

a DFB laser section and a cavity (including a phase control section and an amplifier section), the strength and phase of a light beam, which propagate through the cavity and is then fed back to the DFB laser section, are controlled by injection currents of the amplifier section and the phase control section and are varied to obtain a wide frequency, wherein the DFB laser section includes a complex-coupled diffraction grating and an active structure for controlling the intensity of laser light, to oscillate the laser light in a specific single mode independent of a phase variation of feedback laser light; the cavity including the phase control section and the amplifier section, the phase control section having a passive waveguide that controls a phase variation of the feedback laser light, the amplifier section having an active structure that controls the strength of the feedback laser light, wherein the strength and the phase of the feedback laser light are controlled to vary the frequency of an optical pulse produced by the laser diode; and the DFB laser section and the cavity being monolithically integrated on a single substrate, current being independently injected into each of the sections, wherein the complex-coupled grating of the DFB laser section is a loss-coupled grating formed of InGaAs, which longitudinally periodically varies both effective refractive index and loss, wherein each of the active structures included in the DFB laser section and the amplifier section is formed in a manner in which a first light guiding layer, an active layer, and a second light guiding layer are sequentially deposited, wherein the guiding layer of the phase control section is arranged through butt-coupling such that its central axis accords with those of the active structures.

2. The self-mode locked multi-section semiconductor laser diode as claimed in claim 1, wherein the DFB laser section and the cavity are monolithically integrated in accordance with a PBH structure.

3. The self-mode locked multi-section semiconductor laser diode as claimed in claim 1, wherein the DFB laser section and the cavity are monolithically integrated in accordance with a ridge structure.

4. The self-mode locked multi-section semiconductor laser diode as claimed in claim 1, wherein each of the first and second light guiding layers is formed of InGaAsP having a band gap of 1.3 μm and has a thickness of 70 nm, and the active layer has a multi-quantum-well structure with a band gap of 1.55 μm including wells and barriers according to InGaAsP.

5. The self-mode locked multi-section semiconductor laser diode as claimed in claim 1, wherein each of the first and second light guiding layers is formed of InGaAsP having a band gap of 1.3 μm and has a thickness of 70 nm, and the active layer is formed of InGaAsP having a band gap of 1.55 μm.

6. The self-mode locked multi-section semiconductor laser diode as claimed in claim 1, wherein the guiding layer of the phase control section has a thickness of 400 nm and is made of InGaAsP having a band gap of 1.3 μm.

7. The self-mode locked multi-section semiconductor laser diode as claimed in claim 1, wherein the DFB laser section, the phase control section, and the amplifier section are constructed through evanescent-coupling in which the sections have a common guiding layer.

8. The self-mode locked multi-section semiconductor laser diode as claimed in claim 1, wherein the phase control section is located between the DFB laser section and the amplifier section.

9. The self-mode locked multi-section semiconductor laser diode as claimed in claim 1, wherein the amplifier section is located between the DFB laser section and the phase control section.

10. The self-mode locked multi-section semiconductor laser diode as claimed in claim 1, wherein the facet of the DFB laser section is coated with an anti-reflection film, whereas the facet of the external cavity, opposite to the facet of the DFB laser region, is coated with a high-reflection film or is left as cleaved.

* * * * *